US012672331B2

(12) United States Patent
Lin

(10) Patent No.: US 12,672,331 B2
(45) Date of Patent: Jun. 30, 2026

(54) SEMICONDUCTOR DEVICE AND METHOD OF FORMING THE SAME

(71) Applicant: Powerchip Semiconductor Manufacturing Corporation, Hsinchu (TW)

(72) Inventor: Meng-Han Lin, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 680 days.

(21) Appl. No.: 18/192,672

(22) Filed: Mar. 30, 2023

(65) Prior Publication Data

US 2024/0243187 A1    Jul. 18, 2024

(30) Foreign Application Priority Data

Jan. 18, 2023    (TW) ................................. 112102408

(51) Int. Cl.
| *H10D 64/01* | (2025.01) |
| *H10D 10/01* | (2025.01) |
| *H10D 10/60* | (2025.01) |
| *H10D 62/10* | (2025.01) |

(52) U.S. Cl.
CPC ......... *H10D 64/017* (2025.01); *H10D 10/061* (2025.01); *H10D 10/60* (2025.01); *H10D 62/115* (2025.01)

(58) Field of Classification Search
None
See application file for complete search history.

(56) References Cited

U.S. PATENT DOCUMENTS

| 8,237,227 B2 | 8/2012 | Lai et al. |
| 8,901,673 B2 | 12/2014 | Onda |
| 10,510,685 B2 | 12/2019 | Chen et al. |
| (Continued) | | |

FOREIGN PATENT DOCUMENTS

| TW | I264826 | 10/2006 |
| TW | I737535 | 8/2021 |
| (Continued) | | |

OTHER PUBLICATIONS

"Office Action of Taiwan Counterpart Application", issued on Mar. 22, 2024, p. 1-p. 4.

*Primary Examiner* — Steven B Gauthier
*Assistant Examiner* — Lamont B Koo
(74) *Attorney, Agent, or Firm* — JCIPRNET

(57) ABSTRACT

The present disclosure provides a semiconductor device and a method for forming the same. The semiconductor device includes a substrate including first to third active regions, a device isolation structure defining the first to third active regions in the substrate, first and second devices buried in the first and second active regions, respectively, a third device disposed on the third active region, an insulation layer disposed on the substrate and including a first portion covering the first device, a second portion covering the second device and a third portion surrounding a portion of the third device, and a first dummy gate structure disposed on the first active region and embedded in the first portion of the insulation layer. The horizontal area of the first portion is greater than the horizontal area of the third portion.

16 Claims, 14 Drawing Sheets

(56)            References Cited

U.S. PATENT DOCUMENTS

| 11,264,402 | B2 | 3/2022 | Wu et al. |
| 2010/0001369 | A1* | 1/2010 | Chuang .............. H10D 84/0109 |
| | | | 438/234 |
| 2019/0057962 | A1* | 2/2019 | Lu ....................... H01L 23/5228 |
| 2019/0097013 | A1* | 3/2019 | Chen ................... H01L 21/7684 |
| 2019/0103367 | A1* | 4/2019 | Chen ................... H10D 62/126 |

FOREIGN PATENT DOCUMENTS

| TW | 202145441 | 12/2021 |
| TW | 202220166 | 5/2022 |

* cited by examiner

MDGS1  MDGS2  MDGS3  MDGS3  MDGS3

CE    BE    EE1    EE2    EE3    R1

MDGS6  MDGS5

MDGS4

ANE    CAE

R2

SEMICONDUCTOR DEVICE AND METHOD OF FORMING THE SAME

CROSS-REFERENCE TO RELATED APPLICATION

This application claims the priority benefit of Taiwan application serial no. 112102408, filed on Jan. 18, 2023. The entirety of the above-mentioned patent application is hereby incorporated by reference herein and made a part of this specification.

BACKGROUND OF THE INVENTION

1. Field of the Invention

The present invention is related to a semiconductor device and a method of forming the semiconductor device.

2. Description of Related Art

In the current semiconductor manufacturing process, replacing the traditional polysilicon gate with a high-k metal gate (HKMG) is one of means to improve the performance of semiconductor devices. In the process of forming the HKMG, a gate-last technique is usually adopted to form a metal gate of metal-oxide-semiconductor field-effect transistor (MOSFET). Namely, the metal gate of a gate structure is formed at last during the process of forming the gate structure of the MOSFET. For example, in the gate-last technique, a dummy gate is usually formed in advance to reserve a position where the metal gate is to be formed in the subsequent process. After that, the dummy gate is removed and then fills with a metal material so as to replace the dummy gate with the metal gate after forming an insulation layer (ILDO) surrounding the gate structure.

In the process of forming the insulation layer that surrounds the gate structure, a planarization process (e.g., a chemical mechanical polishing (CMP) process) is usually adopted to remove excess insulation materials, so that a top surface of the dummy gate can be exposed and then the subsequent process of replacing the dummy gate with the metal gate can be performed. However, the above CMP process may affect semiconductor components in other positions. For example, some semiconductor components such as a finger bipolar junction transistor (Finger BJT), a schottky barrier diode (SBD), and the like are formed in the substrate, so the insulation layer that forms on the substrate and covers those semiconductor components includes a large area that does not form any structure (also referred to as ILDO ISO), as such a dishing may occur in the ILDO ISO where those semiconductor components are disposed thereunder. As such, in the process of replacing the dummy gate with the metal gate, the metal material is prone to retain in the dishing and thus cannot be removed during the CMP process, so that the residual metal material may be peeled off in the subsequent processes and cause pollution.

SUMMARY OF THE INVENTION

The present invention provides a semiconductor device and a method of forming the semiconductor device, wherein the first dummy gate structure is designed to be embedded in the first portion of the insulation layer on the first active region, so that the dishing is not prone to occur in the insulation layer above the first device during the CMP process. As such, in the process of replacing the dummy gate with the metal gate, the metal material would not retain in the dishing generated in the CMP process and thus the pollution caused by the metal material peeling off from the dishing in the subsequent processes can be avoided.

An embodiment of the present invention provides a semiconductor device including a substrate, a device isolation structure, a first device, a second device, a third device, an insulation layer, and a first dummy gate structure. The substrate includes a first active region, a second active region, and a third active region. The device isolation structure defines the first active region, the second active region, and the third active region in the substrate. The first device and the second device are respectively buried in the first active region and the second active region of the substrate. The third device is disposed on the third active region of the substrate. The insulation layer is disposed on the substrate and includes a first portion covering the first device, a second portion covering the second device, and a third portion surrounding a portion of the third device. A horizontal area of the first portion is greater than a horizontal area of the third portion. The first dummy gate structure is disposed on the first active region and embedded in the first portion of the insulation layer.

In some embodiments, the first device includes a collector pattern, a base pattern, and an emitter pattern. The collector pattern is buried in a first region of the first active region that is defined by the device isolation structure and a first isolation pattern disposed in the first active region and surrounded by the device isolation structure. The base pattern is buried in a second region of the first active region that is defined by the first isolation pattern and a second isolation pattern disposed in the first active region and surrounded by the first isolation pattern. The emitter pattern is buried in a third region of the first active region that is defined by the second isolation pattern. The first dummy gate structure includes a first dummy pattern, a second dummy pattern, and a third dummy pattern spaced apart from each other. The first dummy pattern is disposed on a portion of the device isolation structure defining the first active region and surrounds the collector pattern in a top view. The second dummy pattern is disposed on the first isolation pattern and surrounds the base pattern in the top view. The third dummy pattern is disposed on the second isolation pattern and surrounds the emitter pattern in the top view.

In some embodiments, the first portion of the insulation layer includes a first insulation pattern, a second insulation pattern, and a third insulation pattern spaced apart from each other. The first insulation pattern is disposed on the first region and between the first dummy pattern and the second dummy pattern. The second insulation pattern is disposed on the second region and between the second dummy pattern and the third dummy pattern. The third insulation pattern is disposed on the third region and surrounded by the third dummy pattern.

In some embodiments, the semiconductor device further includes a second dummy gate structure disposed on the second active region and embedded in the second portion of the insulation layer, wherein a horizontal area of the second portion of the insulation layer is greater than the horizontal area of the third portion of the insulation layer.

In some embodiments, the second device includes a cathode pattern and an anode pattern. The cathode pattern is buried in a fourth region of the second active region that is defined by the device isolation structure and a third isolation pattern disposed in the second active region and surrounded by the device isolation structure. The anode pattern is buried in a fifth region of the second active region that is defined by the third isolation pattern. The second dummy gate structure includes a fourth dummy pattern and a fifth dummy pattern. The fourth dummy pattern is disposed on a portion of the device isolation structure defining the second active region and surrounds the cathode pattern in a top view. The fifth dummy pattern is disposed on the third isolation pattern and surrounds the anode pattern in the top view.

In some embodiments, the second dummy gate structure includes a sixth dummy pattern disposed on the fifth region. The anode pattern surrounds the sixth dummy pattern in the top view.

In some embodiments, the second portion of the insulation layer includes a fourth insulation pattern and a fifth insulation pattern spaced apart from each other. The fourth insulation pattern is disposed on the fourth region and between the fourth dummy pattern and the fifth dummy pattern. The fifth insulation pattern is disposed on the fifth region and between the fifth dummy pattern and the sixth dummy pattern.

In some embodiments, the third device includes a gate structure and source/drains. The gate structure is disposed on the third active region and surrounded by the third portion of the insulation layer. The source/drains are disposed in the third active region at opposite sides of the gate structure.

In some embodiments, the gate structure includes a metal material, and the first dummy gate structure includes a metal material identical to the metal material of the gate structure.

In some embodiments, the first dummy gate structure is electrically floating.

An embodiment of the present invention provides a method of forming a semiconductor device, which includes: forming a device isolation structure defining a first active region, a second active region, and a third active region in a substrate; forming a first device and a second device being respectively buried in the first active region and the second active region of the substrate; forming a third device on the third active region of the substrate; forming a first dummy gate structure on the first active region; and forming an insulation layer on the substrate, wherein the insulation layer includes a first portion covering the first device, a second portion covering the second device, and a third portion surrounding a portion of the third device, and a horizontal area of the first portion is greater than a horizontal area of the third portion, and the first dummy gate structure is embedded in the first portion of the insulation layer.

In some embodiments, forming the first device includes: forming a first isolation pattern and a second isolation pattern spaced apart from each other in the first active region during a step of forming the device isolation structure, wherein the first isolation pattern is surrounded by the device isolation structure, and the second isolation pattern is surrounded by the first isolation pattern; forming a collector pattern in a first region of the first active region that is defined by the device isolation structure and the first isolation patter; forming a base pattern in a second region of the first active region that is defined by the first isolation pattern and the second isolation pattern; and forming an emitter pattern in a third region of the first active region that is defined by the second isolation pattern. The first dummy gate structure is formed to include a first dummy pattern, a second dummy pattern, and a third dummy pattern spaced apart from each other. The first dummy pattern is formed on a portion of the device isolation structure defining the first active region and surrounds the collector pattern in a top view. The second dummy pattern is formed on the first isolation pattern and surrounds the base pattern in the top view. The third dummy pattern is formed on the second isolation pattern and surrounds the emitter pattern in the top view.

In some embodiments, the first portion of the insulation layer is formed to include a first insulation pattern, a second insulation pattern, and a third insulation pattern spaced apart from each other. The first insulation pattern is formed on the first region and between the first dummy pattern and the second dummy pattern. The second insulation pattern is formed on the second region and between the second dummy pattern and the third dummy pattern. The third insulation pattern is formed on the third region and is surrounded by the third dummy pattern.

In some embodiments, forming the second device includes: forming a third isolation pattern in the second active region during a step of forming the device isolation structure, wherein the third isolation pattern is surrounded by the device isolation structure; forming a cathode pattern in a fourth region of the second active region that is defined by the device isolation structure and the third isolation pattern; and forming an anode pattern in a fifth region of the second active region that is defined by the third isolation pattern. The second dummy gate structure is formed to include a fourth dummy pattern and a fifth dummy pattern. The fourth dummy pattern is formed on a portion of the device isolation structure defining the second active region and surrounds the cathode pattern in a top view. The fifth dummy pattern is formed on the third isolation pattern and surrounds the anode pattern in the top view.

In some embodiments, the second dummy gate structure includes a sixth dummy pattern formed on the fifth region. The anode pattern surrounds the sixth dummy pattern in the top view.

In some embodiments, the second portion of the insulation layer is formed to include a fourth insulation pattern and a fifth insulation pattern spaced apart from each other. The fourth insulation pattern is formed on the fourth region and between the fourth dummy pattern and the fifth dummy pattern. The fifth insulation pattern is formed on the fifth region and between the fifth dummy pattern and the sixth dummy pattern.

In some embodiments, forming the third device includes: forming a gate structure on the third active region during a step of forming the first dummy gate structure, wherein the gate structure is surrounded by the third portion of the insulation layer; and forming source/drains in the third active region at opposite sides of the gate structure.

In some embodiments, the gate structure includes a metal material, and the first dummy gate structure includes a metal material identical to the metal material of the gate structure.

In some embodiments, forming the insulation layer on the substrate includes: forming an insulation material layer on the substrate, wherein the insulation material layer covers the first device, the second device, the third device and the first dummy gate structure; and performing a planarization process on the insulation material layer to form the insulation layer, wherein a top surface of the insulation layer is coplanar with a top surface of the first dummy gate structure.

Based on the above, in the aforementioned semiconductor device and the method of forming the semiconductor device, the first dummy gate structure is disposed on the first active region and embedded in the first portion of the insulation layer, so that the dishing is not prone to occur in the insulation layer above the first device during the CMP process. As such, in the process of replacing the dummy gate with the metal gate, the metal material would not retain in the dishing generated in the CMP process and thus the pollution caused by the metal material peeling off from the dishing in the subsequent processes can be avoided.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
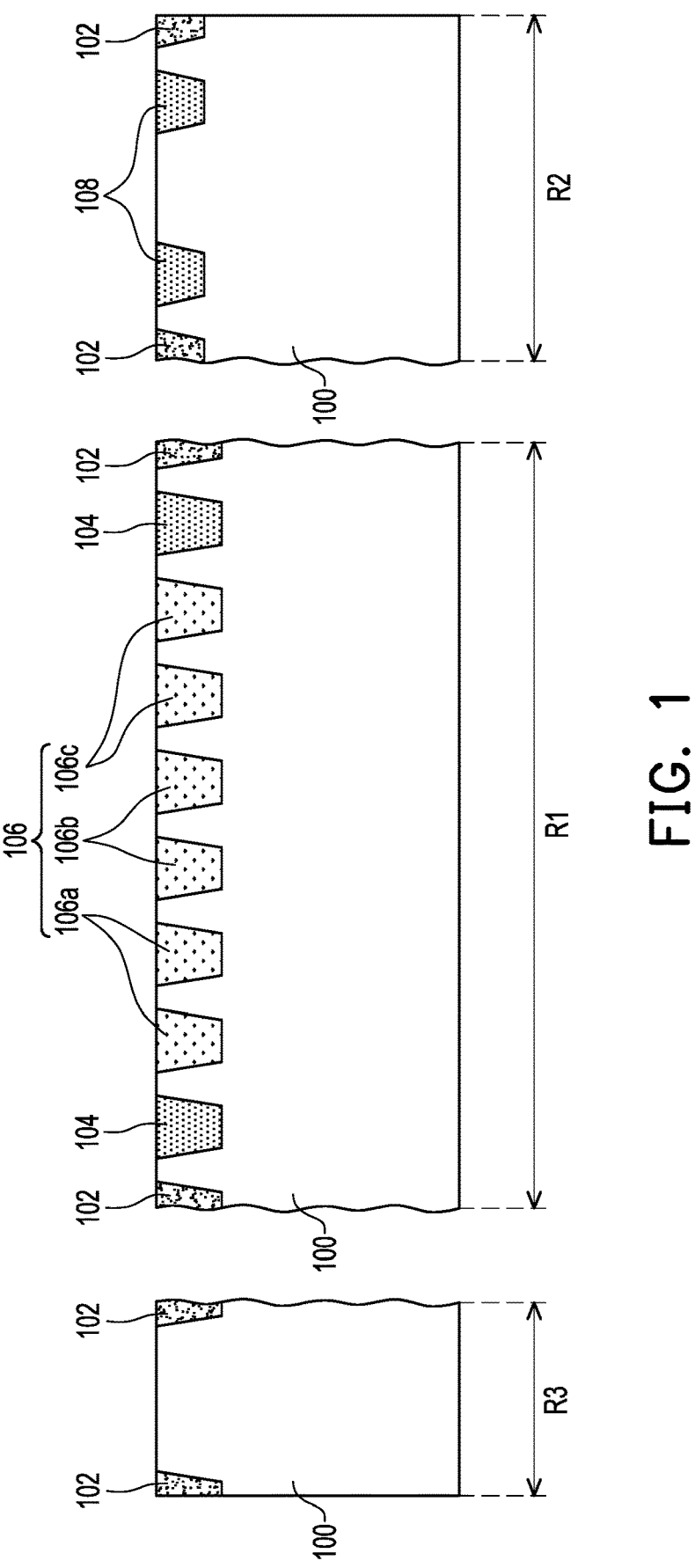
FIG. 1 to FIG. 10 are schematic cross-section views illustrating a method of forming a semiconductor device of an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection).

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within +30%, +20%, +10%, +5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

FIG. 1 to FIG. 10 are schematic cross-section views illustrating a method of forming a semiconductor device of an embodiment of the present invention. FIG. 1(a) and FIG. 1(b) are respectively schematic top views illustrating regions R1 and R2 of FIG. 1 in an embodiment of the present invention. FIG. 2(a) and FIG. 2(b) are respectively schematic top views illustrating regions R1 and R2 of FIG. 2 in an embodiment of the present invention. FIG. 6(a) and FIG. 6(b) are respectively schematic top views illustrating regions R1 and R2 of FIG. 6 in an embodiment of the present invention. FIG. 10(a) and FIG. 10(b) are respectively schematic top views illustrating regions R1 and R2 of FIG. 10 in an embodiment of the present invention. For convenience of illustration, FIG. 10(a) only shows first to third dummy patterns MDGS1 to MDGS3, a collector pattern CE, a base pattern BE, and emitter patterns EE1, EE2, and EE3. For convenience of illustration, FIG. 10(b) only shows fourth to sixth dummy patterns MDGS4 to MDGS6, a cathode pattern CAE, and an anode pattern ANE.

In some embodiments, a method of forming a semiconductor device (e.g., semiconductor device 10 shown in FIG. 10) includes following steps. Firstly, referring to FIG. 1, FIG. 1(a), and FIG. 1(b), a device isolation structure 102 defining a first active region R1, a second active region R2, and a third active region R3 is formed in a substrate 100.

The substrate 100 may include a semiconductor substrate or a semiconductor on insulator (SOI) substrate. Materials of the semiconductor substrate or the SOI substrate may include element semiconductors, alloy semiconductors, or compound semiconductors. For example, the element semiconductors may include Si or Ge. The alloy semiconductors may include SiGe, SiGeC, or the like. The compound semiconductors may include SiC, III-V semiconductor materials, or II-VI semiconductor materials. The III-V semiconductor materials may include GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The II-VI semiconductor materials may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. The semiconductor materials may be doped with dopants having a first conductivity type or dopants having a second conductivity type complementary to the first conductivity type. For example, the first conductivity type may be P type, and the second conductivity type may be N type. In some embodiments, the substrate 100 may be doped with P type dopants. In some embodiments, the device isolation structure 102 may include silicon oxide.

Next, a first device (e.g., D1 of FIG. 6) and a second device (e.g., D2 of FIG. 6) respectively buried in the first active region R1 and the second active region R2 of the substrate 100 are formed. A third device (e.g., D3 of FIG. 6) is formed on the third active region R3 of the substrate 100. A first dummy gate structure (e.g., DGS1 to DGS3 of FIG. 6) is formed on the first active region R1. In some embodiments, the first device, the second device, the third device, and the first dummy gate structure may be formed by following steps.

Figure 1A:
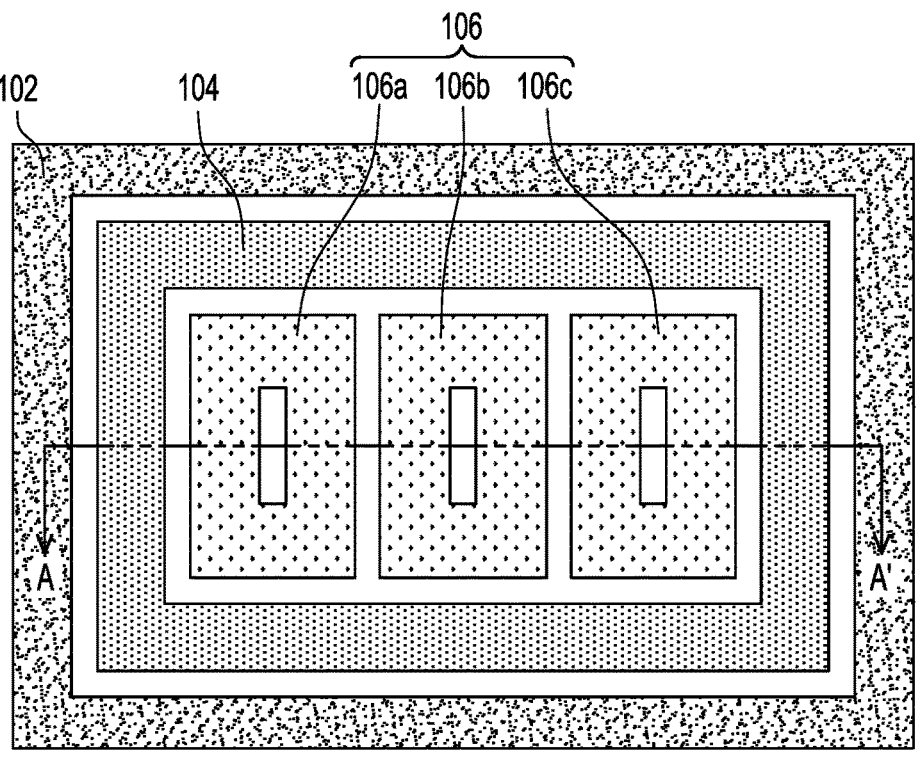
FIG. 1(a) and FIG. 1(b) are respectively schematic top views illustrating regions R1 and R2 of FIG. 1 in an embodiment of the present invention.
Figure 1B:
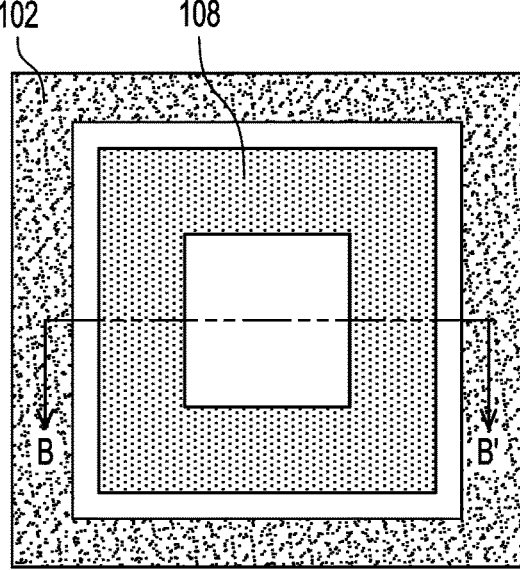

Firstly, referring to FIG. 1, FIG. 1(*a*), and FIG. 1(*b*), in a step of forming the device isolation structure 102, a first isolation pattern 104 and a second isolation pattern 106 spaced apart from each other are formed in the first active region R1, and a third isolation pattern 108 is formed in the second active region R2. In some embodiments, as shown in FIG. 1(*a*), the first isolation pattern 104 is surrounded by the device isolation structure 102, and the second isolation pattern 106 is surrounded by the first isolation pattern 104. In some embodiments, the second isolation pattern 106 may include isolation patterns 106*a*, 106*b*, and 106*c* spaced apart from each other. In some embodiments, as shown in FIG. 1(*b*), the third isolation pattern 108 is surrounded by the device isolation structure 102. In some embodiments, a schematic cross-sectional view taken along the line A-A' in FIG. 1(*a*) may be corresponded to the first active region R1 illustrating in FIG. 1. In some embodiments, a schematic cross-sectional view taken along the line B-B' in FIG. 1(*b*) may be corresponded to the second active region R2 illustrating in FIG. 1.

Figure 2:
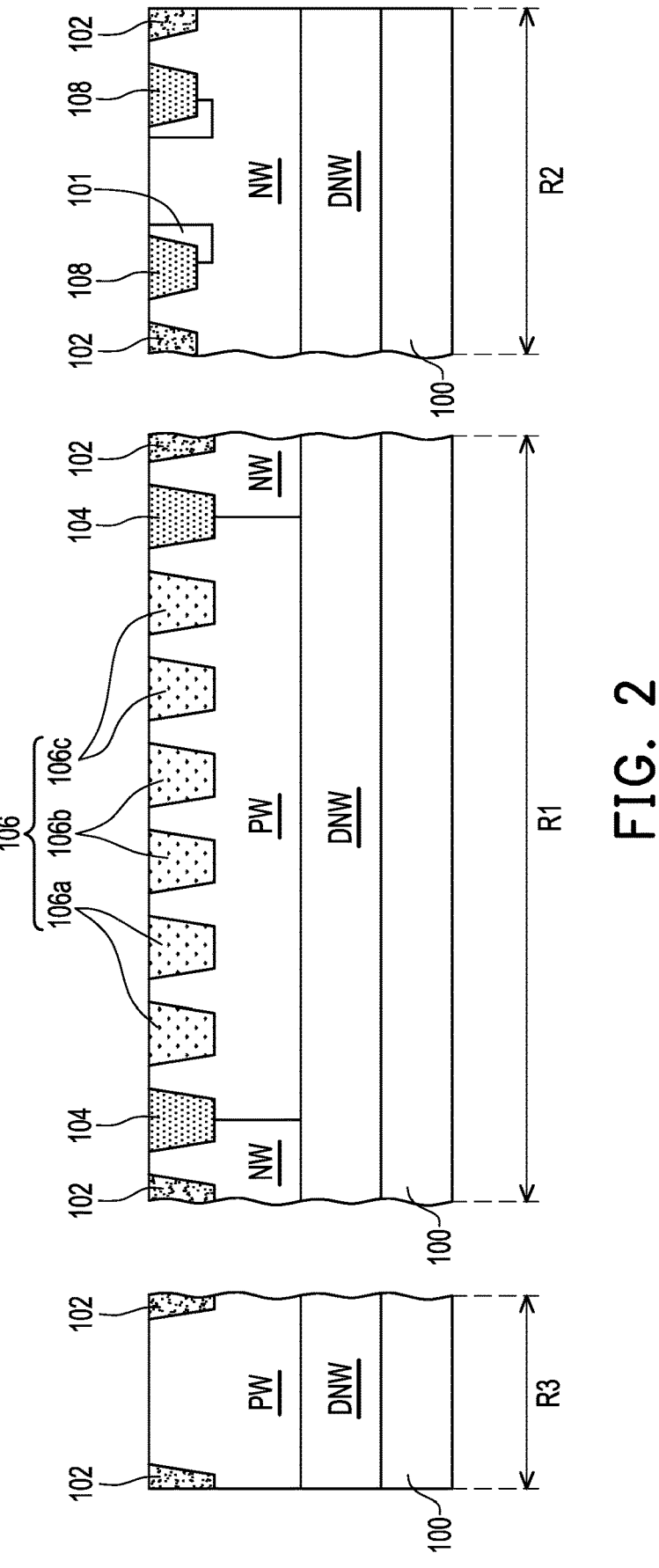
Figure 2A:
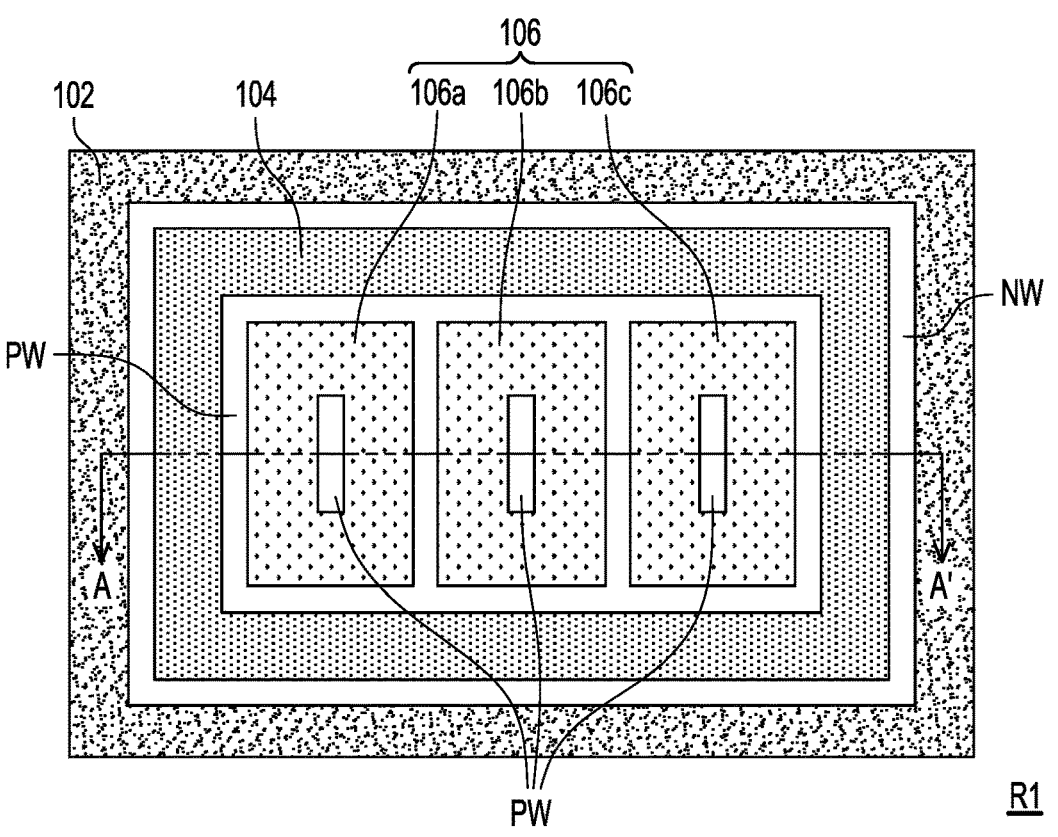
FIG. 2(a) and FIG. 2(b) are respectively schematic top views illustrating regions R1 and R2 of FIG. 2 in an embodiment of the present invention.
Figure 2B:
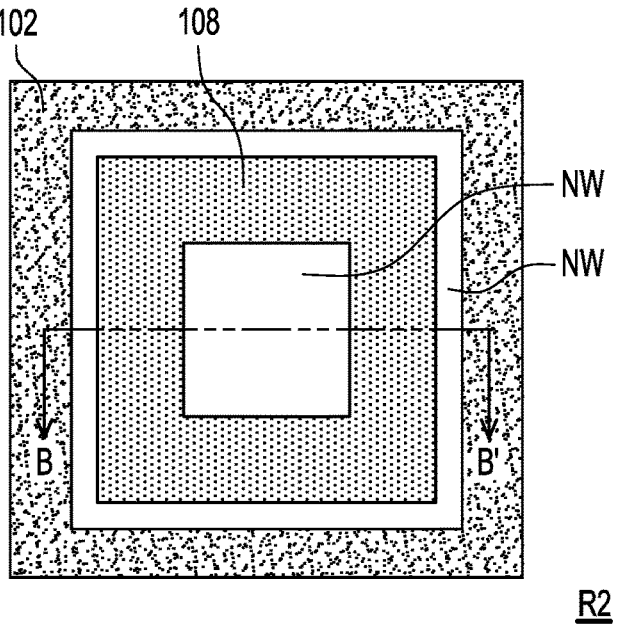

After that, referring to FIG. 2, FIG. 2(*a*), and FIG. 2(*b*), a deep well region DNW is formed in the first active region R1, the second active region R2, and the third active region R3 of the substrate 100. Then, a well region NW is formed in the deep well region DNW of the first active region R1 and the second active region R2. The well region NW of the first active region R1 may be formed in a region defined by the device isolation structure 102 and the first isolation pattern 104. Then, a well region PW is formed in the deep well region DNW of the first active region R1 and the third active region R3. The well region PW of the first active region R1 may be formed in a region defined by the first isolation pattern 104 and may be surrounded by the well region NW. In some embodiments, a doped region 101 may be formed in a region of the second active region R2 that is defined by the third isolation pattern 108. The doped region 101 may be formed in the well region NW of the second active region R2 and may be located at sidewalls of the third isolation pattern 108 away from the device isolation structure 102. In the case where the substrate 100 is doped with a P type dopant, the deep well region DNW may be doped with a N type dopant, the well region NW may be doped with a N type dopant, and the well region PW and the doped region 101 may be doped with a P type dopant. In some embodiments, a schematic cross-sectional view taken along the line A-A' in FIG. 2(*a*) may be corresponded to the first active region R1 illustrating in FIG. 2. In some embodiments, a schematic cross-sectional view taken along the line B-B' in FIG. 2(*b*) may be corresponded to the second active region R2 illustrating in FIG. 2.

Figure 3:
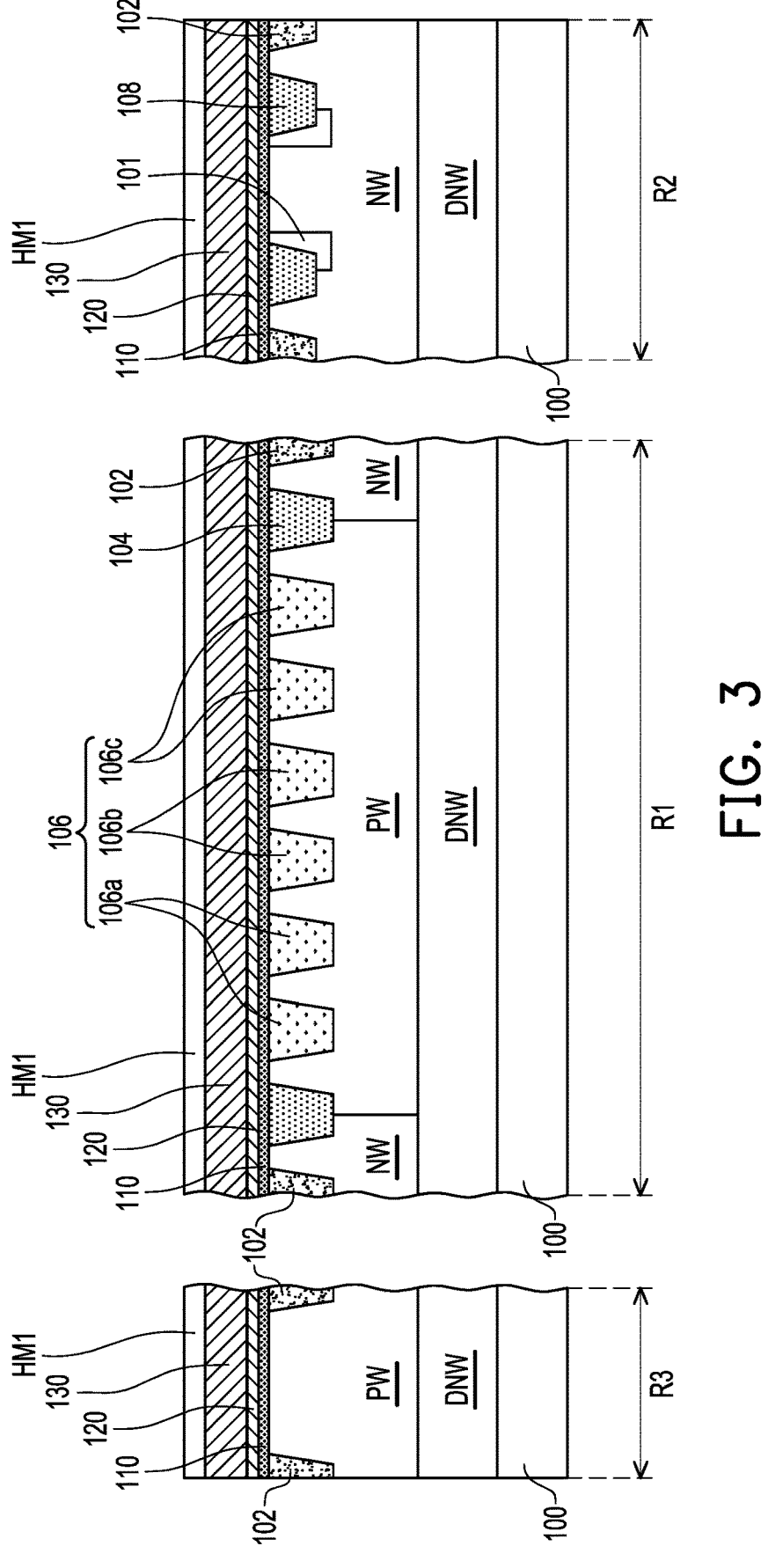

Then, referring to FIG. 3, a high dielectric constant material layer 110, a barrier layer 120, a gate layer 130, and a hard mask layer HM1 are formed on the substrate 100, sequentially.

The high dielectric constant material layer 110 may include dielectric materials having high dielectric constant. For example, the dielectric materials having high dielectric constant may be materials having dielectric constants higher than that of silicon oxide (about 3.9). In some embodiments, the high dielectric constant material layer 110 may include $HfO_2$, $TiO_2$, HfZrO, $Ta_2O_3$, HfSiO4, $ZrO_2$, $ZrSiO_2$, LaO, AlO, ZrO, TiO, $Ta_2O_5$, $Y_2O_3$, BaZrO, HfZrO, HfLaO, HfSiO, LaSiO, AlSiO, HfTaO, HfTiO, $Al_2O_3$, $Si_3N_4$, SiON or combinations thereof. The barrier layer 120 may include TiN. The gate layer 130 may include polysilicon. The hard mask layer HM1 may include oxides, nitrides, or a combination thereof.

Figure 4:
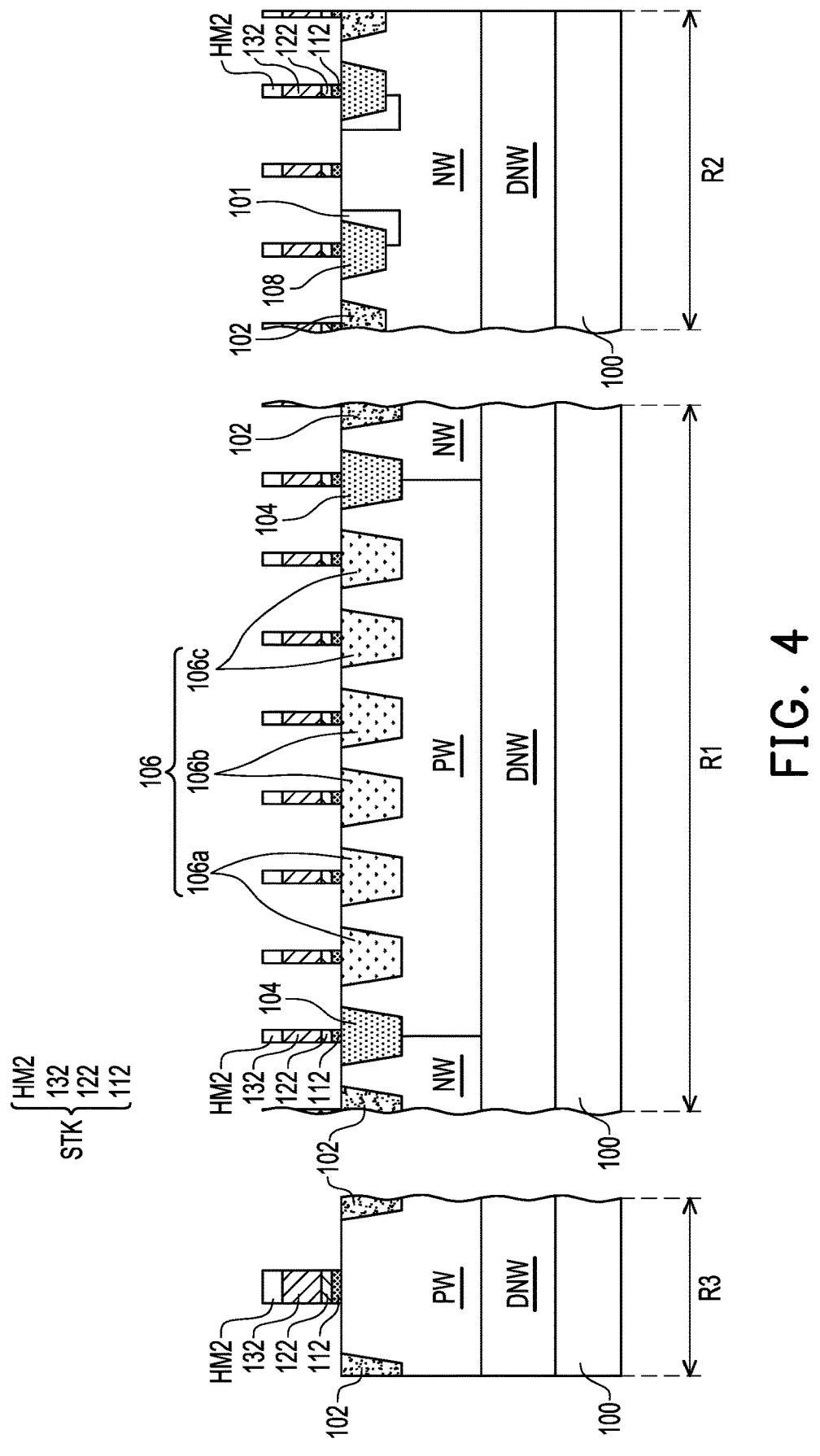

After that, referring to FIG. 3 and FIG. 4, a patterning process is performed on the high dielectric constant material layer 110, the barrier layer 120, the gate layer 130, and the hard mask layer HM1 to form stacked structures STK. Each of the stacked structures STK includes a high dielectric constant pattern 112, a barrier pattern 122, a gate pattern 132, and a hard mask pattern HM2. In the first active region R1, the stacked structures STK may be disposed on the device isolation structure 102, the first isolation pattern 104, and the second isolation pattern 106. In the second active region R2, the stacked structures STK may be disposed on the device isolation structure 102 and the third isolation pattern 108. In some embodiments, the stacked structures STK may be disposed on a region of the second active region R2 that is defined by the third isolation pattern 108. In the third active region R3, the stacked structures STK may be disposed on a region defined by the device isolation structure 102.

Figure 5:
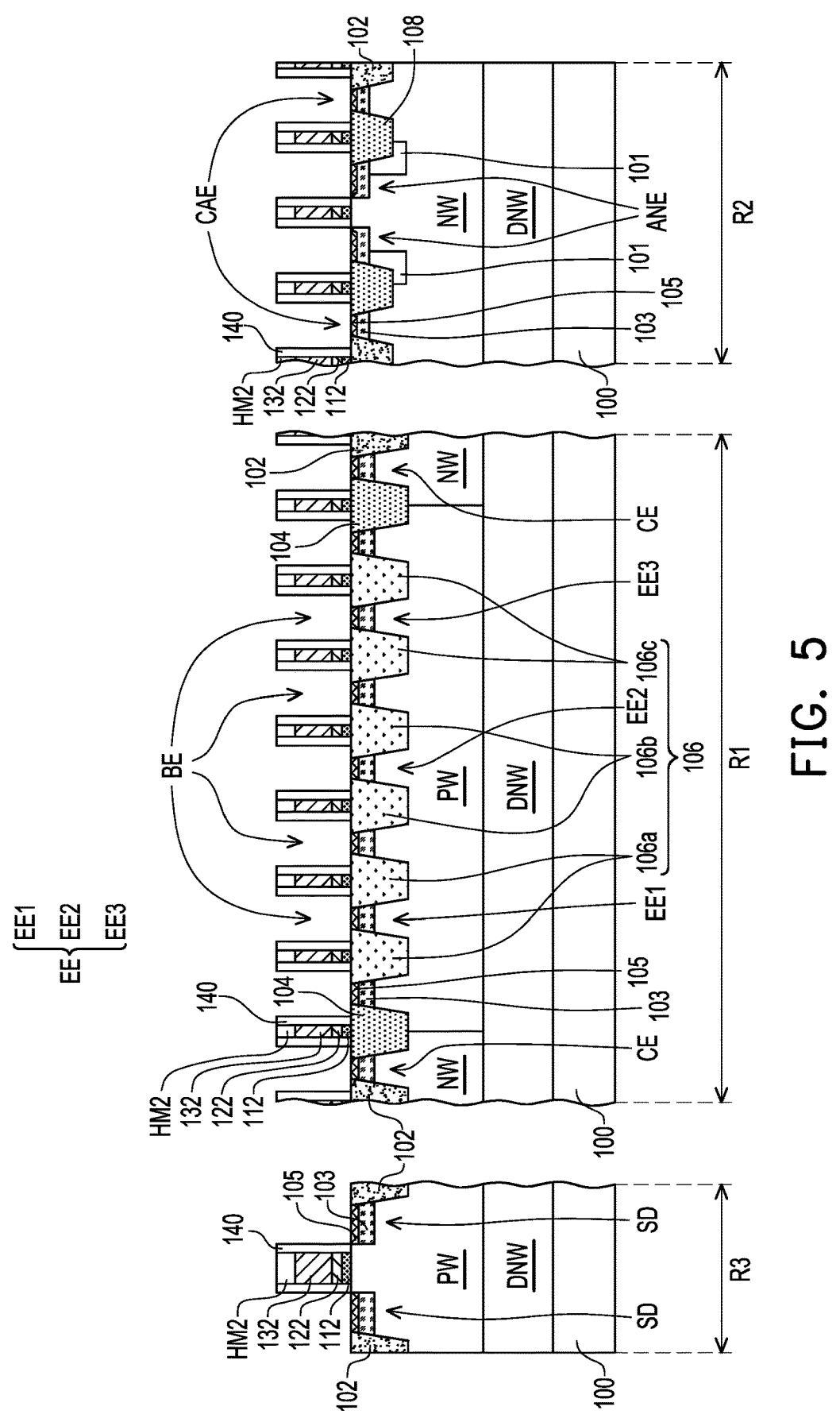

Then, referring to FIG. 4 and FIG. 5, spacers 140 are formed on two opposite sidewalls of each stacked structures STK. The spacers 140 may include silicon oxide, silicon nitride, or a combination thereof.

And then, a doping process is performed on the first active region R1, the second active region R2, and the third active region R3 to form doped regions 103 in the first active region R1, the second active region R2, and the third active region R3, respectively. In the first active region R1, the doped regions 103 may be formed in regions defined by the device isolation structure 102, the first isolation pattern 104, and the second isolation pattern 106. In the second active region R2, the doped regions 103 may be formed in regions defined by the device isolation structure 102 and the third isolation pattern 108. In some embodiments, in the case where the stacked structures STK are formed on the region defined by the third isolation pattern 108 in the second active region R2, the doped regions 103 may be formed in regions defined by the device isolation structure 102, the third isolation pattern 108, and the stacked structures STK in a top view. In the third active region R3, the doped regions 103 may be formed in regions defined by the device isolation structure 102 and the stacked structures STK in the top view.

After that, silicide layers 105 are formed in the doped regions 103 by a self-aligned metal silicide process. As such, the first device (e.g., D1 of FIG. 6) and the second device (e.g., D2 of FIG. 6) may be formed in the first active region R1 and the second active region R2, respectively, and source/drains SD of the third device (e.g., D3 of FIG. 6) may be formed in the third active region R3. The first device may include a collector pattern CE, a base pattern BE, and an emitter pattern EE, and each of the collector pattern CE, the base pattern BE, and the emitter pattern EE may include the doped region 103 and the silicide layer 105. The second device may include a cathode pattern CAE and an anode pattern ANE, and each of the cathode pattern CAE and the anode pattern ANE may include the doped region 103 and the silicide layer 105. The silicide layers 105 may include tungsten silicide, titanium silicide, cobalt silicide, zirconium silicide, platinum silicide, molybdenum silicide, copper silicide, nickel silicide or combinations thereof.

Figure 6:
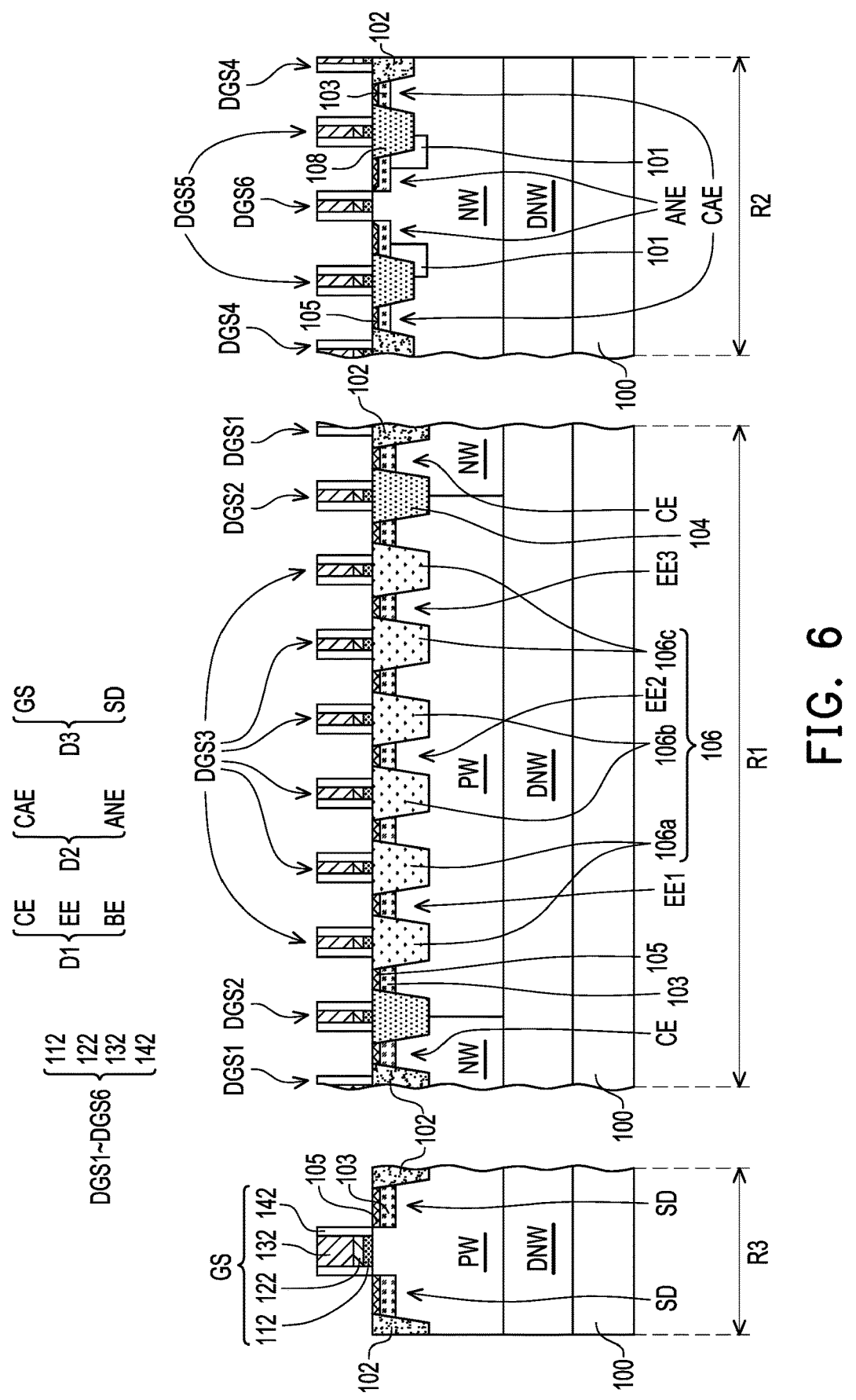
Figure 6A:
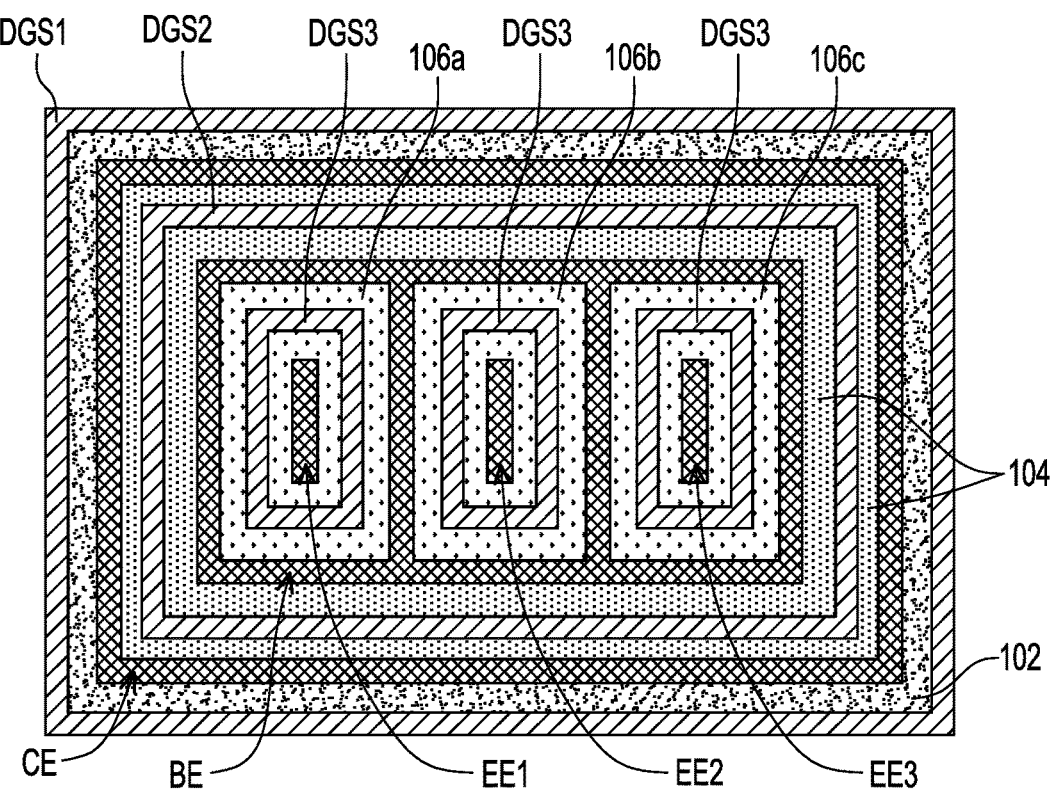
FIG. 6(a) and FIG. 6(b) are respectively schematic top views illustrating regions R1 and R2 of FIG. 6 in an embodiment of the present invention.
Figure 6B:
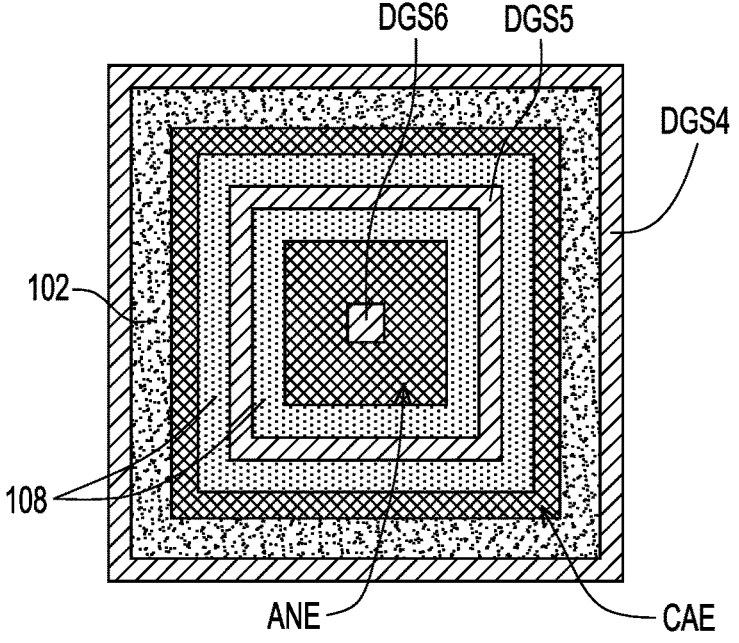

Then, referring to FIG. 5 and FIG. 6, the hard mask patterns HM2 of the stacked structures STK are removed to form a first dummy gate structure (e.g., DGS1 to DGS3 of FIG. 6), a second dummy gate structure (e.g., DGS4 to DGS6 of FIG. 6), and a gate structure GS. The first dummy gate structure is formed on the first active region R1 and includes a first dummy pattern DGS1, a second dummy pattern DGS2 and a third dummy pattern DGS3. The second dummy gate structure is formed on the second active region R2 and includes a fourth dummy pattern DGS4, a fifth dummy pattern DGS5, and a sixth dummy pattern DGS6. The gate structure GS is formed on the third active region R3. In a step of removing the hard mask pattern HM2, portions of the spacers 140 located on side surfaces of the hard mask patterns HM2 are removed accordingly, so each of the gate structure GS and the first to sixth dummy patterns DGS1 to DGS6 are formed to include the high dielectric constant pattern 112, the barrier pattern 122, the gate pattern 132, and spacers 142.

As shown in FIG. 6 and FIG. 6(a), the collector pattern CE of the first device D1 is formed in a first region of the first active region R1 that is defined by the device isolation structure 102 and the first isolation pattern 104. The base pattern BE of the first device D1 is formed in a second region of the first active region R1 that is defined by the first isolation pattern 104 and the second isolation pattern 106. The emitter pattern EE of the first device D1 is formed in a third region of the first active region R1 that is defined by the second isolation pattern 106. In the case where the second isolation pattern 106 includes isolation patterns 106a, 106b, and 106c, the emitter pattern EE may include emitter patterns EE1, EE2, and EE3 respectively formed in regions of the first active region R1 that are defined by the isolation patterns 106a, 106b, and 106c.

The first dummy pattern DGS1 is formed on a portion of the device isolation structure 102 defining the first active region R1 and surrounds the collector pattern CE in a top view. The second dummy pattern DGS2 is formed on the first isolation pattern 104 and surrounds the base pattern BE in the top view. The third dummy pattern DGS3 is formed on the second isolation pattern 106 and surrounds the emitter pattern EE. In the case where the second isolation pattern 106 includes isolation patterns 106a, 106b, and 106c spaced apart from each other, the third dummy patterns DGS3 are formed to position on the isolation patterns 106a, 106b, and 106c and surround the emitter patterns EE1, EE2, and EE3, respectively.

As shown in FIG. 6 and FIG. 6(b), the cathode pattern CAE of the second device D2 is formed in a fourth region of the second active region R2 that is defined by the device isolation structure 102 and the third isolation pattern 108. The anode pattern ANE of the second device D2 is formed in a fifth region that is defined by the third isolation pattern 108.

The fourth dummy pattern DGS4 is formed on a portion of the device isolation structure 102 defining the second active region R2 and surrounds the cathode pattern CAE in a top view. The fifth dummy pattern DGS5 is formed on the third isolation pattern 108 and surrounds the anode pattern ANE in the top view. The sixth dummy pattern DGS6 is formed on the fifth region, and the anode pattern ANE surrounds the sixth dummy pattern DGS6 in the top view.

As shown in FIG. 6, the third device D3 may include the gate structure GS and the source/drains SD. The gate structure GS is formed on the third active region R3 defined by the device isolation structure 102, and the source/drains SD are formed in the third active region R3 at two opposite sides of the gate structure GS.

Figure 7:
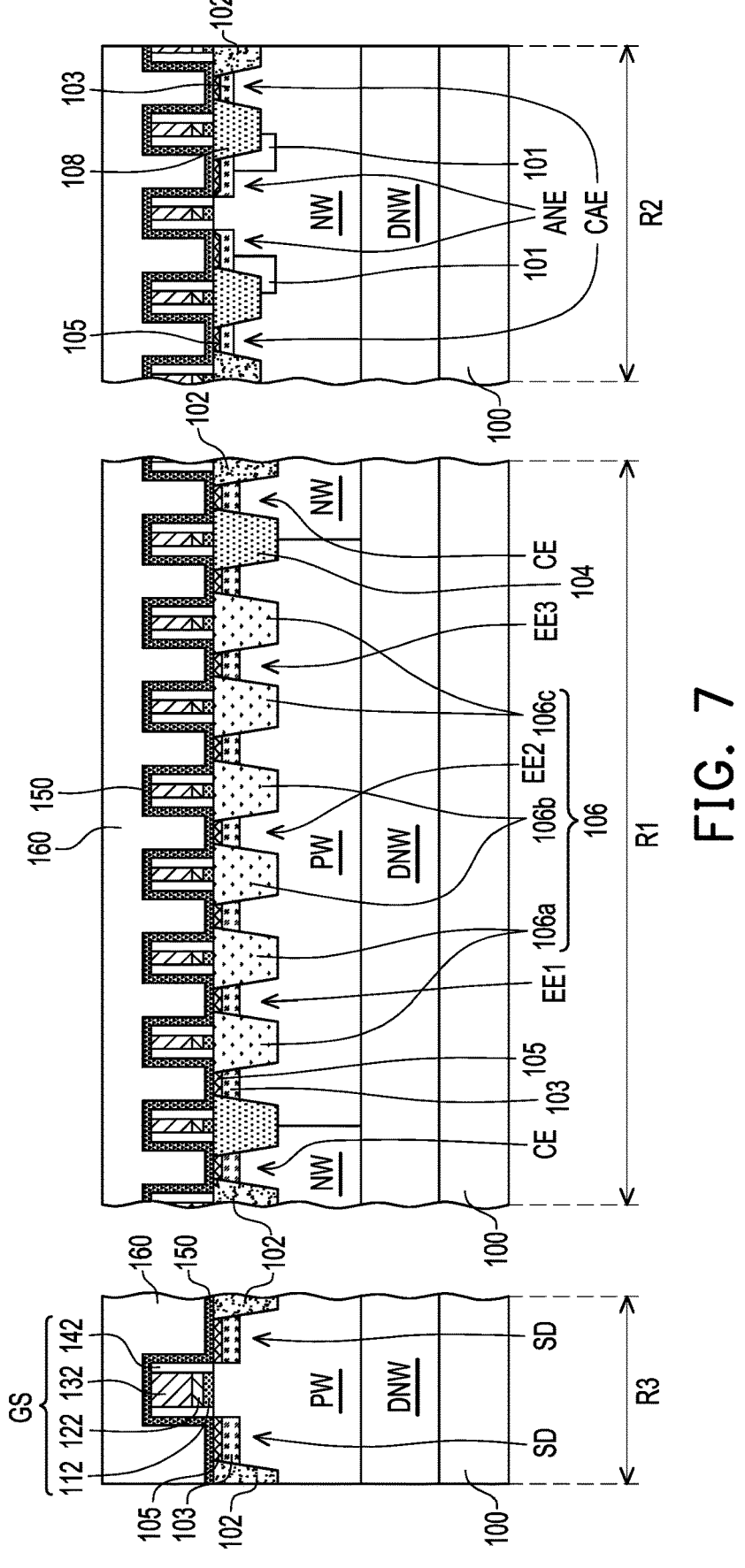

Next, referring to FIG. 6 and FIG. 7, an etching stop material layer 150 and a dielectric material layer 160 are sequentially formed on the substrate 100. The etching stop material layer 150 may be conformally formed on surfaces of the substrate 100, the first to sixth dummy patterns DGS1 to DGS6, and the gate structure GS. The dielectric material layer 160 may cover the first to third dummy patterns DGS1 to DGS3 on the first active region R1, the fourth to sixth dummy patterns DGS4 to DGS6 on the second active region R2, and the gate structure GS on the third active region R3. The etching stop material layer 150 may include materials such as silicon nitride. The dielectric material layer 160 may include dielectric materials such as silicon oxide.

Figure 8:
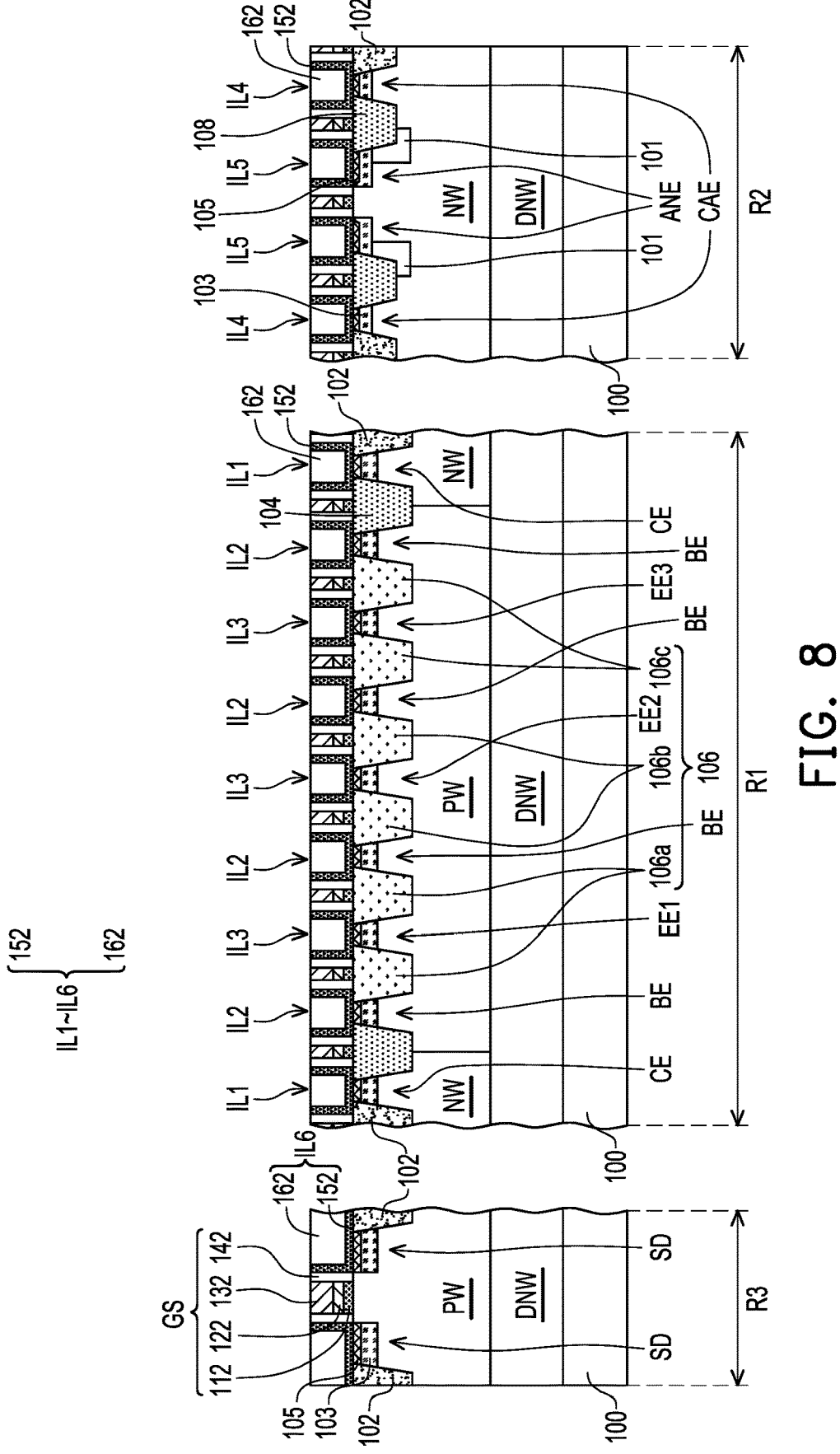

Then, referring to FIG. 7 and FIG. 8, a planarization process is performed on the dielectric material layer 160 and the etching stop material layer 150 so as to form a dielectric layer 162 and an etching stop layer 152. In some embodiments, the dielectric layer 162 may be an interlayer dielectric layer (e.g., ILDO). In some embodiments, the etching stop layer 152 may be a contact etch stop layer (CESL). As shown in FIG. 8, insulation patterns IL1 to IL6 formed on the substrate 100 may each include the etching stop layer 152 and the dielectric layer 162. The insulation patterns IL1 to IL3 (also referred to as a first portion of the insulation layer) formed on the first active region R1 may cover the first device D1. The insulation patterns IL4 and IL5 (also referred to as a second portion of the insulation layer) formed on the second active region R2 may cover the second device D2. The insulation pattern IL6 (also referred to as a third portion of the insulation layer) formed on the third active region R3 may cover the third device D3. In some embodiments, a horizontal area of the first portion of the insulation layer is greater than a horizontal area of the third portion of the insulation layer. In the case where the first dummy gate structure (e.g., DGS1 to DGS3 of FIG. 6) is embedded in the first portion of the insulation layer (e.g., IL1 to IL3 of FIG. 8), the dishing is not prone to occur in the insulation layer above the first device D1 during the CMP process. As such, in the process of replacing the dummy gate with the metal gate, the metal material would not retain in the dishing generated in the CMP process and thus the pollution caused by the metal material peeling off from the dishing in the subsequent processes can be avoided.

Figure 9:
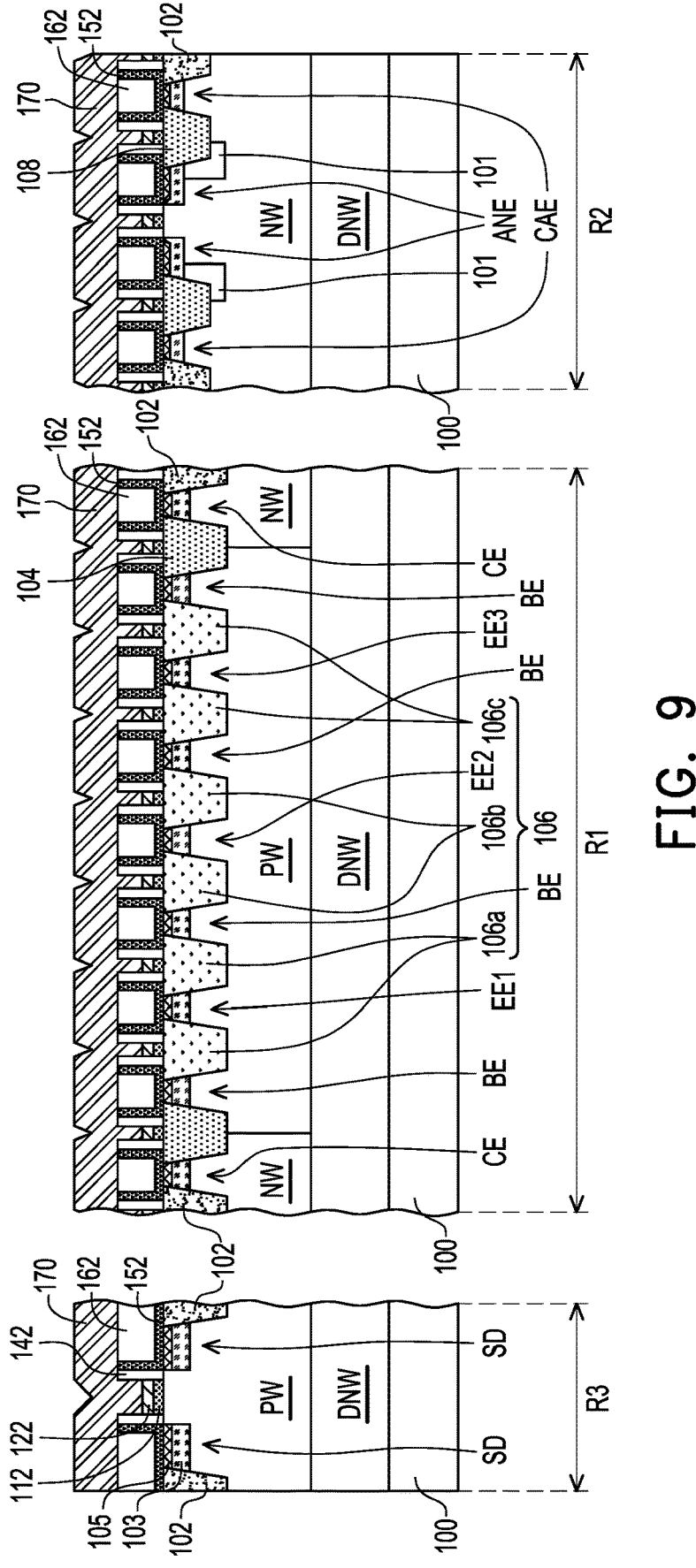

After that, referring to FIG. 8 and FIG. 9, the gate patterns 132 of the gate structure GS and the first to sixth dummy patterns DGS1 to DGS6 are removed, and then a metal material layer 170 is formed on the insulation patterns IL1 to IL6 and fills into spaces formed by removing the gate patterns 132. The metal material layer 170 may include tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt) or other suitable materials.

Figure 10:
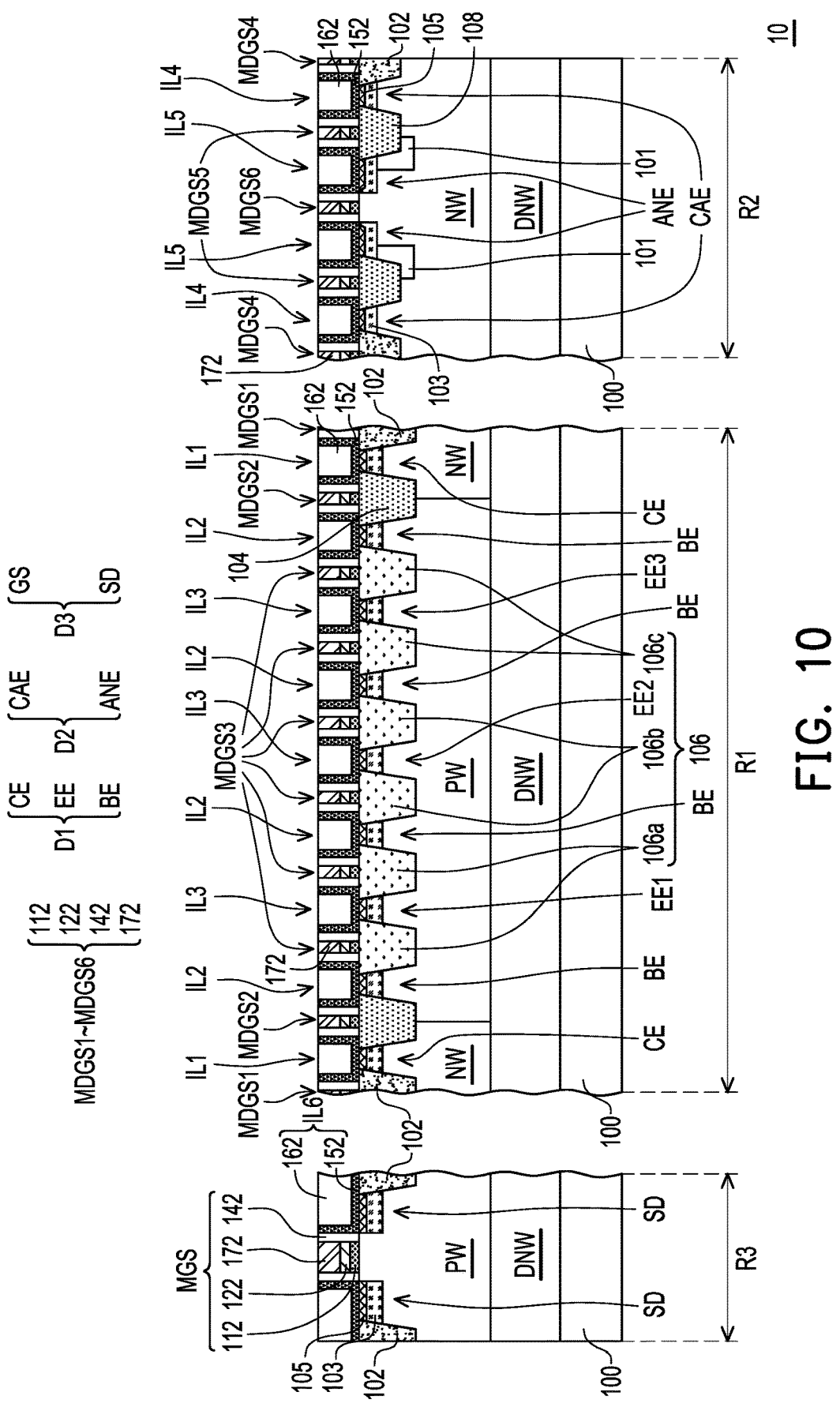
Figure 10A:
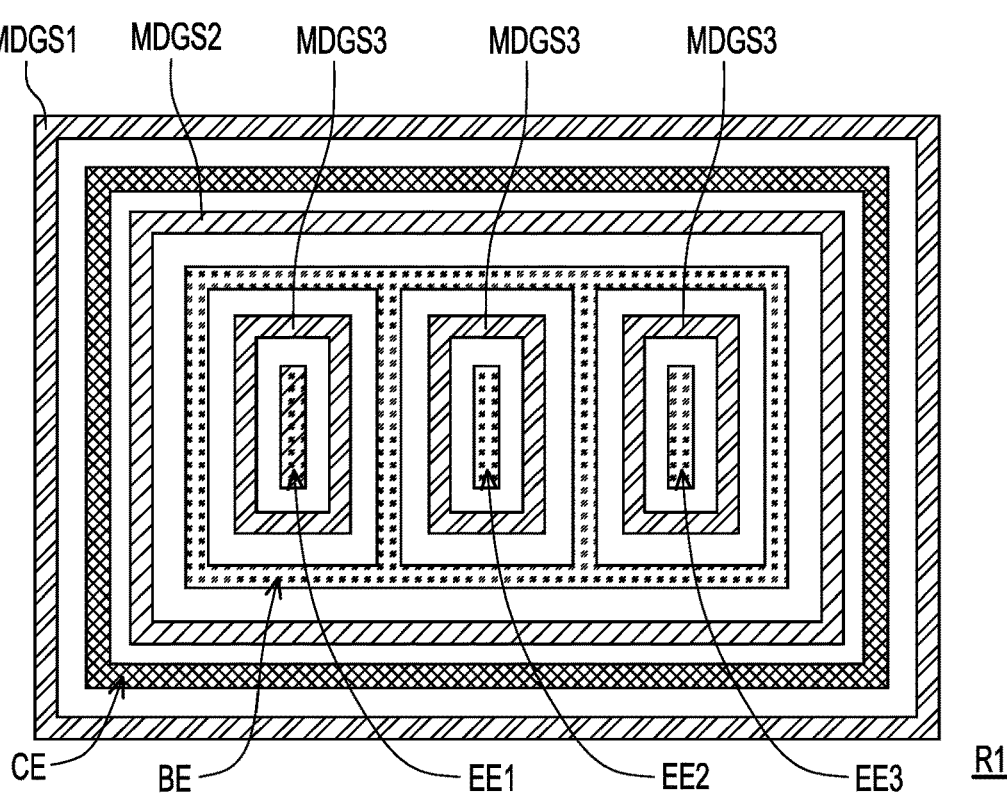
FIG. 10(a) and FIG. 10(b) are respectively schematic top views illustrating regions R1 and R2 of FIG. 10 in an embodiment of the present invention.
Figure 10B:
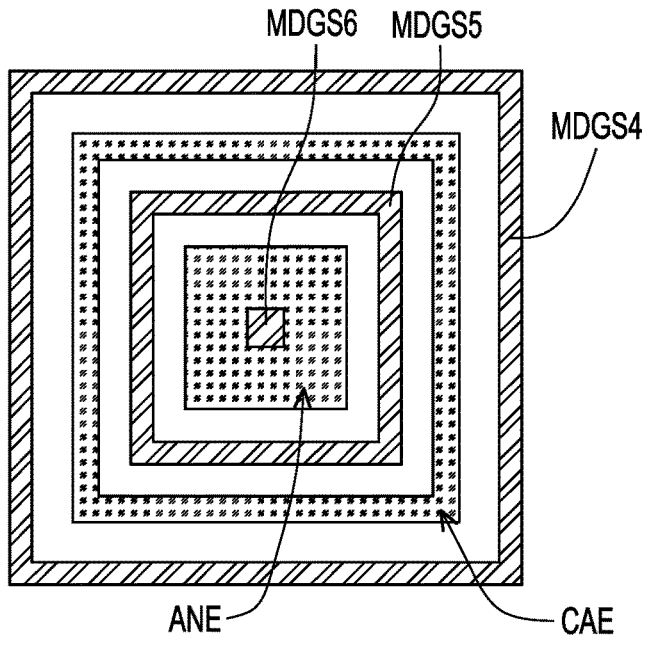

Then, referring to FIG. 9 and FIG. 10, a planarization process such as CMP is performed on the metal material layer 170 to form a gate structure MGS, a first dummy gate structure including first to third dummy patterns MDGS1 to MDGS3 and a second dummy gate structure including fourth to sixth dummy patterns MDGS4 to MDGS6. The gate structure MGS and the first to sixth dummy patterns MDGS1 to MDGS6 may each include the high dielectric constant pattern 112, the barrier pattern 122, the spacers 142, and a metal gate 172. In some embodiments, top surfaces of the insulation patterns IL1 to IL3 are coplanar with top surfaces of the first to third dummy patterns MDGS1 to MDGS3 of the first dummy gate structure. In some embodiments, top surfaces of the insulation patterns IL4 and IL5 are coplanar with top surfaces of the fourth to sixth dummy patterns MDGS4 to MDGS6 of the second dummy gate structure. In some embodiments, a top surface of the insulation pattern IL6 is coplanar with a top surface of the gate structure MGS. In some embodiments, metal materials included in the gate structure MGS (e.g., materials of the metal gate 172) are identical to metal materials included in the first dummy gate structure (e.g., materials of the metal gate 172). In some embodiments, the metal materials included in the gate structure MGS are identical to metal materials included in the second dummy gate structure (e.g., materials of the metal gate 172).

In some embodiments, referring to FIG. 10 and FIG. 10(a), the first portion of the insulation layer may be formed to include a first insulation pattern IL1, a second insulation pattern IL2, and a third insulation pattern IL3 spaced apart from each other. The first insulation pattern IL1 may be formed on the collector pattern CE and between the first dummy pattern MDGS1 and the second dummy pattern MDGS2. The second insulation pattern IL2 may be formed on the base pattern BE and between the second dummy pattern MDGS2 and the third dummy pattern MDGS3. The third insulation pattern IL3 may be formed on the emitter pattern EE and may be surrounded by the third dummy pattern MDGS3.

In some embodiments, referring to FIG. 10 and FIG. 10(b), the second portion of the insulation layer may be formed to include fourth and fifth insulation patterns IL4 and IL5 spaced apart from each other. The fourth insulation pattern IL4 may be formed on the cathode pattern CAE and between the fourth dummy pattern MDGS4 and the fifth dummy pattern MDGS5. The fifth insulation pattern IL5 may be formed on the anode pattern ANE and between the fifth dummy pattern MDGS5 and the sixth dummy pattern MDGS6.

Hereinafter, the semiconductor device 10 will be described with reference to FIG. 10, FIG. 10(a), and FIG. 10(b). The semiconductor device 10 may be formed by the aforementioned method, but the invention is not limited thereto.

The semiconductor device 10 includes a substrate 100, a device isolation structure 102, a first device D1, a second device D2, a third device D3, an insulation layer (e.g., IL1 to IL6 of FIG. 10), and a first dummy gate structure (e.g., MDGS1 to MDGS3). The substrate 100 includes a first active region R1, a second active region R2, and a third active region R3. The device isolation structure 102 defines the first active region R1, the second active region R2, and the third active region R3 in the substrate 100. The first device D1 and the second device D2 are embedded in the first active region R1 and the second active region R2 of the substrate 100, respectively. The third device D3 is disposed on the third active region R3 of the substrate 100. The insulation layer is disposed on the substrate 100 and includes a first portion (e.g., IL1 to IL3 of FIG. 10) covering the first device D1, a second portion (e.g., IL4 and IL5 of FIG. 10) covering the second device D2, and a third portion (e.g., IL6 of FIG. 10) surrounding a portion of the third device D3. A horizontal area of the first portion of the insulation layer is greater than a horizontal area of the third portion of the insulation layer. The first dummy gate structure (e.g., MDGS1 to MDGS3 of FIG. 10) is disposed on the first active region R1 and embedded in the first portion of the insulation layer.

In some embodiments, the first device D1 may include a collector pattern CE, a base pattern BE, and an emitter pattern EE. The collector pattern CE may be embedded in a first region of the first active region R1 that is defined by the device isolation structure 102 and a first isolation pattern 104 disposed in the first active region R1 and surrounded by the device isolation structure 102. The base pattern BE may be embedded in a second region of the first active region R1 that is defined by the first isolation pattern 104 and a second isolation pattern 106 disposed in the first active region R1 and surrounded by the first isolation pattern 104. The emitter pattern EE may be embedded in a third region of the first active region R1 that is defined by the second isolation pattern 106.

In some embodiments, the first dummy gate structure (e.g., MDGS1 to MDGS3 of FIG. 10) may include a first dummy pattern MDGS1, a second dummy pattern MDGS2, and a third dummy pattern MDGS3 spaced apart from each other. The first dummy pattern MDGS1 is disposed on a portion of the device isolation structure 102 defining the first active region R1 and surrounds the collector pattern CE in a top view. The second dummy pattern MDGS2 is disposed on the first isolation pattern 104 and surrounds the base pattern BE in the top view. The third dummy pattern MDGS3 is disposed on the second isolation pattern 106 and surrounds the emitter pattern EE in the top view.

In some embodiments, the first portion (e.g., IL1 to IL3 of FIG. 10) of the insulation layer may include a first insulation pattern IL1, a second insulation pattern IL2, and a third insulation pattern IL3 spaced apart from each other. The first insulation pattern IL1 is disposed on the first region and between the first dummy pattern MDGS1 and the second dummy pattern MDGS2. The second insulation pattern IL2 is disposed on the second region and between the second dummy pattern MDGS2 and the third dummy pattern MDGS3. The third insulation pattern IL3 is disposed on the third region and is surrounded by the third dummy pattern MDGS3.

In some embodiments, the semiconductor device 10 may further include a second dummy gate structure (e.g., MDGS4 to MDGS6 of FIG. 10) disposed on the second active region R2 and embedded in the second portion (e.g., IL4 and IL5 of FIG. 10) of the insulation layer, wherein a horizontal area of the second portion of the insulation layer is greater than the horizontal area of the third portion (e.g., IL6 of FIG. 10) of the insulation layer.

In some embodiments, the second device D2 may include a cathode pattern CAE and an anode pattern ANE. The cathode pattern CAE is buried in a fourth region of the second active region R2 that is defined by the device isolation structure 102 and a third isolation pattern 108 disposed in the second active region R2 and surrounded by the device isolation structure 102. The anode pattern ANE is embedded in a fifth region of the second active region R2 that is defined by the third isolation pattern 108.

In some embodiments, the second dummy gate structure (e.g., MDGS4 to MDGS6 of FIG. 10) may include a fourth dummy pattern MDGS4 and a fifth dummy pattern MDGS5. The fourth dummy pattern MDGS4 is disposed on a portion of the device isolation structure 102 defining the second active region R2 and surrounds the cathode pattern CAE in a top view. The fifth dummy pattern MDGS5 is disposed on the third isolation pattern 108 and surrounds the anode pattern ANE in the top view. In some embodiments, the second dummy gate structure may further include a sixth dummy pattern MDGS6 disposed on the fifth region. The anode pattern ANE surrounds the sixth dummy pattern MDGS6 in the top view.

In some embodiments, the second portion (e.g., IL4 and IL5 of FIG. 10) of the insulation layer may include a fourth insulation pattern IL4 and a fifth insulation pattern IL5 spaced apart from each other. The fourth insulation pattern IL4 is disposed on the fourth region and between the fourth dummy pattern MDGS4 and the fifth dummy pattern MDGS5. The fifth insulation pattern IL5 is disposed on the fifth region and between the fifth dummy pattern MDGS5 and the sixth dummy pattern MDGS6.

In some embodiments, the third device D3 may include a gate structure MGS and source/drains SD. The gate structure MGS is disposed on the third active region R3 and is surrounded by the third portion (e.g., IL6 of FIG. 10) of the insulation layer. The source/drains SD are disposed in the third active region R3 at two opposite sides of the gate structure MGS.

In some embodiments, the gate structure MGS may include metal materials (e.g., metal gate 172), and the first dummy gate structure may include the same metal materials (e.g., metal gate 172) as that of the gate structure MGS. In some embodiments, the first dummy gate structure (e.g., MDGS1 to MDGS3 of FIG. 10) and the second dummy gate structure (e.g., MDGS4 to MDGS6 of FIG. 10) are electrically floating.

Based on the above, in the semiconductor device and the method of forming the semiconductor device of the aforementioned embodiments, the first dummy gate structure is disposed on the first active region and embedded in the first portion of the insulation layer, so that the dishing is not prone to occur in the insulation layer above the first device during the CMP process. As such, in the process of replacing the dummy gate with the metal gate, the metal material would not retain in the dishing generated during the CMP process and thus the pollution caused by the metal material peeling off from the dishing in the subsequent processes can be avoided.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor device, comprising:
a substrate comprising a first active region, a second active region, and a third active region;
a device isolation structure defining the first active region, the second active region, and the third active region in the substrate;
a first device, a second device and a third device, wherein the first device and the second device are respectively buried in the first active region and the second active region of the substrate, and the third device is disposed on the third active region of the substrate;
an insulation layer disposed on the substrate and comprising a first portion covering the first device, a second portion covering the second device, and a third portion surrounding a portion of the third device, wherein a horizontal area of the first portion is greater than a horizontal area of the third portion; and
a first dummy gate structure disposed on the first active region and embedded in the first portion of the insulation layer, wherein the first device comprises:
a collector pattern buried in a first region of the first active region that is defined by the device isolation structure and a first isolation pattern disposed in the first active region and surrounded by the device isolation structure;
a base pattern buried in a second region of the first active region that is defined by the first isolation pattern and a second isolation pattern disposed in the first active region and surrounded by the first isolation pattern; and
an emitter pattern buried in a third region of the first active region that is defined by the second isolation pattern,
wherein the first dummy gate structure comprises a first dummy pattern, a second dummy pattern and a third dummy pattern spaced apart from each other, wherein the first dummy pattern is disposed on a portion of the device isolation structure defining the first active region and surrounds the collector pattern in a top view, the second dummy pattern is disposed on the first isolation pattern and surrounds the base pattern in the top view, and the third dummy pattern is disposed on the second isolation pattern and surrounds the emitter pattern in the top view,
wherein the first portion of the insulation layer comprises a first insulation pattern, a second insulation pattern, and a third insulation pattern spaced apart from each other, and wherein:
the first insulation pattern is disposed on the first region and between the first dummy pattern and the second dummy pattern,
the second insulation pattern is disposed on the second region and between the second dummy pattern and the third dummy pattern, and
the third insulation pattern is disposed on the third region and surrounded by the third dummy pattern.

2. The semiconductor device of claim 1, further comprising:
a second dummy gate structure disposed on the second active region and embedded in the second portion of the insulation layer, wherein a horizontal area of the second portion of the insulation layer is greater than the horizontal area of the third portion of the insulation layer.

3. The semiconductor device of claim 2, wherein the second device comprises:
a cathode pattern buried in a fourth region of the second active region that is defined by the device isolation structure and a third isolation pattern disposed in the second active region and surrounded by the device isolation structure; and
an anode pattern buried in a fifth region of the second active region that is defined by the third isolation pattern,
wherein the second dummy gate structure comprises a fourth dummy pattern and a fifth dummy pattern, the fourth dummy pattern is disposed on a portion of the device isolation structure defining the second active region and surrounds the cathode pattern in a top view, and the fifth dummy pattern is disposed on the third isolation pattern and surrounds the anode pattern in the top view.

4. The semiconductor device of claim 3, wherein the second dummy gate structure comprises a sixth dummy pattern disposed on the fifth region, and the anode pattern surrounds the sixth dummy pattern in the top view.

5. The semiconductor device of claim 4, wherein the second portion of the insulation layer comprises a fourth insulation pattern and a fifth insulation pattern spaced apart from each other, and wherein:

the fourth insulation pattern is disposed on the fourth region and between the fourth dummy pattern and the fifth dummy pattern, and the fifth insulation pattern is disposed on the fifth region and between the fifth dummy pattern and the sixth dummy pattern.

6. The semiconductor device of claim 1, wherein the third device comprises:

a gate structure disposed on the third active region and surrounded by the third portion of the insulation layer; and source/drains disposed in the third active region at opposite sides of the gate structure.

7. The semiconductor device of claim 6, wherein the gate structure comprises a metal material, and the first dummy gate structure comprises a metal material identical to the metal material of the gate structure.

8. The semiconductor device of claim 1, wherein the first dummy gate structure is electrically floating.

9. A method of forming a semiconductor device, comprising:

forming a device isolation structure defining a first active region, a second active region, and a third active region in a substrate;

forming a first device and a second device being respectively buried in the first active region and the second active region of the substrate;

forming a third device on the third active region of the substrate;

forming a first dummy gate structure on the first active region; and forming an insulation layer on the substrate, wherein the insulation layer comprises a first portion covering the first device, a second portion covering the second device, and a third portion covering a portion of the third device, and a horizontal area of the first portion is greater than a horizontal area of the third portion, and the first dummy gate structure is embedded in the first portion of the insulation layer, wherein forming the first device comprises:

forming a first isolation pattern and a second isolation pattern spaced apart from each other in the first active region during a step of forming the device isolation structure, wherein the first isolation pattern is surrounded by the device isolation structure, and the second isolation pattern is surrounded by the first isolation pattern;

forming a collector pattern in a first region of the first active region that is defined by the device isolation structure and the first isolation pattern;

forming a base pattern in a second region of the first active region that is defined by the first isolation pattern and the second isolation pattern; and forming an emitter pattern in a third region of the first active region that is defined by the second isolation pattern, and wherein the first dummy gate structure is formed to comprise a first dummy pattern, a second dummy pattern, and a third dummy pattern spaced apart from each other, wherein the first dummy pattern is formed on a portion of the device isolation structure defining the first active region and surrounds the collector pattern in a top view, the second dummy pattern is formed on the first isolation pattern and surrounds the base pattern in the top view, and the third dummy pattern is formed on the second isolation pattern and surrounds the emitter pattern in the top view.

10. The method of claim 9, wherein the first portion of the insulation layer is formed to comprise a first insulation pattern, a second insulation pattern, and a third insulation pattern spaced apart from each other, wherein:

the first insulation pattern is formed on the first region and between the first dummy pattern and the second dummy pattern, the second insulation pattern is formed on the second region and between the second dummy pattern and the third dummy pattern, and the third insulation pattern is formed on the third region and is surrounded by the third dummy pattern.

11. The method of claim 9, wherein forming the second device comprises:

forming a third isolation pattern in the second active region during a step of forming the device isolation structure, wherein the third isolation pattern is surrounded by the device isolation structure;

forming a cathode pattern in a fourth region of the second active region that is defined by the device isolation structure and the third isolation pattern; and forming an anode pattern in a fifth region of the second active region that is defined by the third isolation pattern, wherein a second dummy gate structure embedded in the second portion of the insulation layer is formed to comprise a fourth dummy pattern and a fifth dummy pattern, the fourth dummy pattern is formed on a portion of the device isolation structure defining the second active region and surrounds the cathode pattern in a top view, and the fifth dummy pattern is formed on the third isolation pattern and surrounds the anode pattern in the top view.

12. The method of claim 11, wherein the second dummy gate structure comprises a sixth dummy pattern formed on the fifth region, and the anode pattern surrounds the sixth dummy pattern in the top view.

13. The method of claim 12, wherein the second portion of the insulation layer is formed to comprise a fourth insulation pattern and a fifth insulation pattern spaced apart from each other, and wherein:

the fourth insulation pattern is formed on the fourth region and between the fourth dummy pattern and the fifth dummy pattern, and the fifth insulation pattern is formed on the fifth region and between the fifth dummy pattern and the sixth dummy pattern.

14. The method of claim 9, wherein forming the third device comprises:

forming a gate structure on the third active region during a step of forming the first dummy gate structure, wherein the gate structure is surrounded by the third portion of the insulation layer; and forming source/drains in the third active region at opposite sides of the gate structure.

15. The method of claim 14, wherein the gate structure comprises a metal material, and the first dummy gate structure comprises a metal material identical to the metal material of the gate structure.

16. The method of claim 9, wherein forming the insulation layer on the substrate comprises:

forming an insulation material layer on the substrate, wherein the insulation material layer covers the first device, the second device, the third device and the first dummy gate structure; and performing a planarization process on the insulation material layer to form the insulation layer, wherein a top surface of the insulation layer is coplanar with a top surface of the first dummy gate structure.

\* \* \* \* \*